(12) United States Patent
Takahashi

(10) Patent No.: US 6,172,825 B1
(45) Date of Patent: *Jan. 9, 2001

(54) CATOPTRIC REDUCTION PROJECTION OPTICAL SYSTEM AND PROJECTION EXPOSURE APPARATUS AND METHOD USING SAME

(75) Inventor: Tomowaki Takahashi, Yokohama (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/398,660

(22) Filed: Sep. 17, 1999

(30) Foreign Application Priority Data

Sep. 22, 1998 (JP) .................................. 10-267706

(51) Int. Cl.⁷ ...................................................... G02B 5/10
(52) U.S. Cl. .......................... 359/859; 359/858; 359/857; 359/364; 359/365
(58) Field of Search ..................................... 359/859, 858, 359/857, 856, 860, 861, 633, 364, 365; 378/34, 35, 85

(56) References Cited

U.S. PATENT DOCUMENTS

| | | | |
|---|---|---|---|
| 4,693,569 | * | 9/1987 | Offner ................................... 359/365 |
| 5,686,728 | * | 11/1997 | Shafer ............................... 250/492.2 |
| 5,805,365 | * | 9/1998 | Sweatt ................................... 359/858 |
| 5,815,310 | | 9/1998 | Williamson ........................... 359/365 |

* cited by examiner

Primary Examiner—Cassandra Spyrou
Assistant Examiner—Mohammad Y. Sikder
(74) Attorney, Agent, or Firm—Oliff & Berridge, PLC

(57) ABSTRACT

A catoptric reduction projection optical system (100), a projection exposure apparatus (EX) and a method using same. The catoptric reduction projection optical system is capable of forming a reduced magnification image of an object present on a first surface (R) onto a third surface W. The system includes a first catoptric optical system (10) capable of forming an intermediate image of the object onto a second surface (IM) and comprises a first mirror pair having a first reflective mirror (M1) and a second reflective mirror (M2). The system also includes a second catoptric optical system (20) capable of imaging the intermediate image onto the third surface, and comprises a second mirror pair having a third reflective mirror (M3) with a concave reflective surface and a fourth reflective mirror (M4) with a reflective surface of a predetermined shape, and a third mirror pair having a fifth reflective mirror (M5) with a convex reflective surface and a sixth reflective mirror (M6) with a concave reflective surface. Light from the first surface forms the intermediate image on the second surface after reflecting from the first mirror pair. Then, the light from the intermediate image is reflected by the second mirror pair in the order of the third reflective mirror and the fourth reflective mirror. The light reflected by the second mirror pair is further reflected by the third mirror pair in the order of the fifth reflective mirror and the sixth reflective mirror. This light is then guided to the third surface.

34 Claims, 5 Drawing Sheets

CATOPTRIC REDUCTION PROJECTION OPTICAL SYSTEM AND PROJECTION EXPOSURE APPARATUS AND METHOD USING SAME

FIELD OF THE INVENTION

The present invention relates to a catoptric reduction projection optical system and projection exposure apparatus and methods using same, for photolithographically manufacturing devices like semiconductor devices, liquid crystal display devices, thin film magnetic heads and the like.

BACKGROUND OF THE INVENTION

With the advance in recent years of microminiaturization in the manufacture of semiconductor devices and semiconductor chip mounting boards, there have beer increasing demands for higher resolving power in the exposure apparatus used to manufacture these items. To satisfy this demand, the wavelength of the light source of the apparatus must be shortened and/or the NA (numerical aperture) of the projection optical system of the apparatus must be increased. If the wavelength is shortened, the optical glasses that can withstand practical use is limited due to the absorption of light. Furthermore, when it comes to the short wavelengths of ultraviolet rays and X-rays, usable optical glasses are nonexistent. In this case, it is impossible to construct reduction projection optical systems that are dioptric or catadioptric.

A reduction catoptric projection optical system is disclosed in, for example, U.S. Pat. No. 5,815,310. The projection optical system disclosed therein includes two sets of reduction optical systems comprising reflective surfaces with a concave-convex-concave configuration, and forms an intermediate image between the two reduction optical systems. This projection optical system has the advantage that its six reflective surfaces increase the number of degrees of freedom for aberration correction. Further, a plane reflective mirror is not needed just for the return path, since the number of reflective surfaces is naturally even. In addition, since the reduction magnification of the entire optical system can be distributed among the reduction optical systems, it has the advantage that the burden of each reduction optical system can be lightened. Unfortunately, however, because the two reduction optical systems are joined by a pair of mirror pairs, the diameter of the mirror pairs unavoidably increases. This results in increased cost of the projection optical system.

SUMMARY OF THE INVENTION

The present invention relates to a catoptric reduction projection optical system and projection exposure apparatus and methods using same, for photolithographically manufacturing devices like semiconductor devices, liquid crystal display devices, thin film magnetic heads and the like.

The present invention has the goal to obtain excellent imaging performance while keeping the diameter of the reflective mirrors small, even with on the order of six reflective surfaces. In the present invention, the word "light" refers generally to electromagnetic radiation including the wavelength range from the visible down to x-ray.

Accordingly, a first aspect of the invention is a catoptric reduction projection optical system capable of forming a reduced magnification image of an object present on a first surface onto a third surface. The system comprises first and second catoptric optical systems. The first catoptric optical system is capable of forming an intermediate image of the object onto a second surface, and comprises a first mirror pair having a first reflective mirror and a second reflective mirror. The second catoptric optical system is capable of imaging the intermediate image formed on the second surface onto the third surface, and comprises a second mirror pair having a third reflective mirror with a concave reflective surface and a fourth reflective mirror with a reflective surface of a predetermined shape, and a third mirror pair having a fifth reflective mirror with a convex reflective surface and a sixth reflective mirror with a concave reflective surface. The light from the first surface forms the intermediate image on the second surface after reflecting from the first mirror pair. Then, the light from the intermediate image is reflected by the second mirror pair in the order of the third reflective mirror and the fourth reflective mirror. Then, the light reflected by the second mirror pair is further reflected by the third mirror pair in the order of the fifth reflective mirror and the sixth reflective mirror, and is then guided to the third surface.

A second aspect of the invention is the catoptric reduction projection optical system as described above, further satisfying the following condition:

$$-0.005 < (p1+p2+p3+p4+p5+p6) < 0.005$$

wherein p1 is a paraxial curvature of the first reflective mirror, p2 is a paraxial curvature of the second reflective mirror, p3 is a paraxial curvature of the third reflective mirror, p4 is a paraxial curvature of the fourth reflective mirror, p5 is a paraxial curvature of the fifth reflective mirror, and p6 is a paraxial curvature of the sixth reflective mirror.

A third aspect of the invention is a projection exposure apparatus for exposing a photosensitive substrate with an image of a reticle. The apparatus comprises an illumination optical system that guides exposure light having an exposure wavelength to the reticle, and the projection optical system as described above. The latter is arranged to receive the exposure light from the reticle to form a reduced image of the reticle and exposing the image onto the photosensitive substrate. The exposure is performed while moving the reticle and the photosensitive substrate relative to the catoptric reduction projection optical system.

A fourth aspect of the invention is a method of exposing a photosensitive substrate with a reduced image of a reticle. The method comprising the steps of first, providing the projection exposure apparatus as described above, then guiding light from the illumination optical system to the reticle, and then forming a reduced image of the reticle onto the photosensitive substrate with the projection exposure apparatus while scanning the reticle and the photosensitive substrate relative to the projection exposure apparatus.

DETAILED DESCRIPTION OF THE INVENTION

The present invention relates to a catoptric reduction projection optical system and projection exposure apparatus and methods using same, for photolithographically manufacturing devices like semiconductor devices, liquid crystal display devices, thin film magnetic heads and the like.

Figure 1:
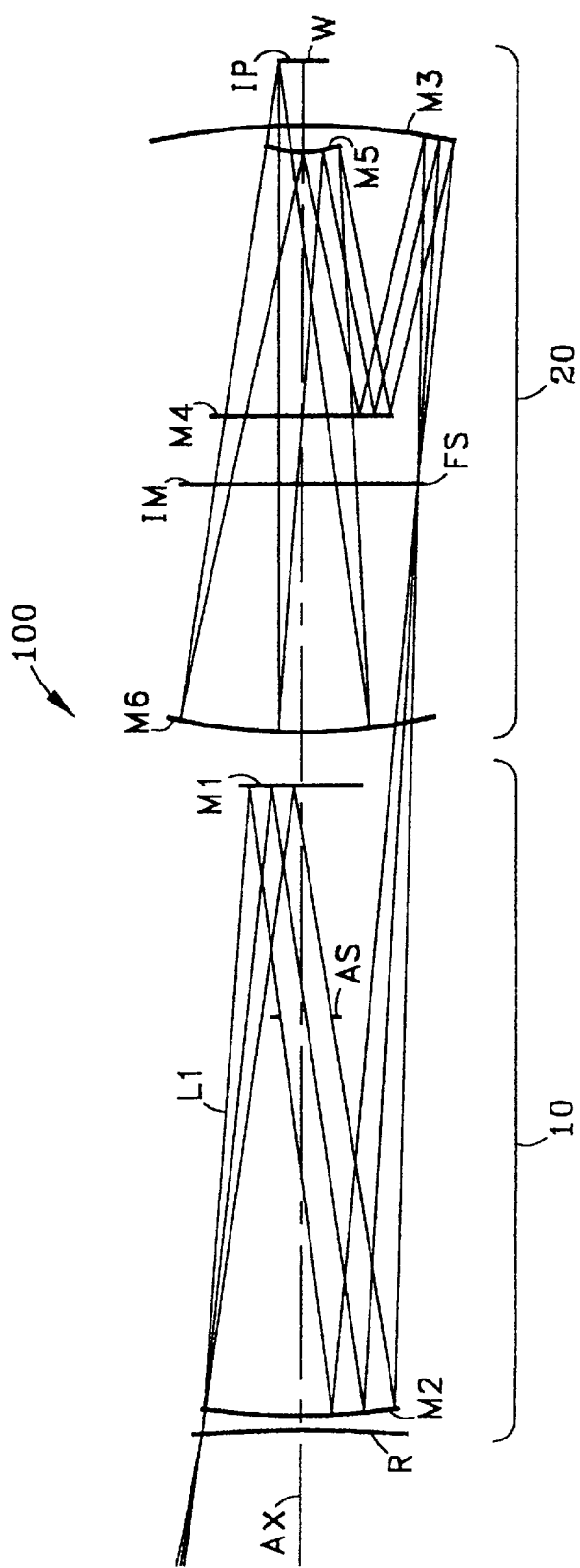
FIG. 1 is a cross-sectional schematic optical diagram of the catoptric reduction projection optical system according to a Working Example 1 of the present invention.
Figure 4:
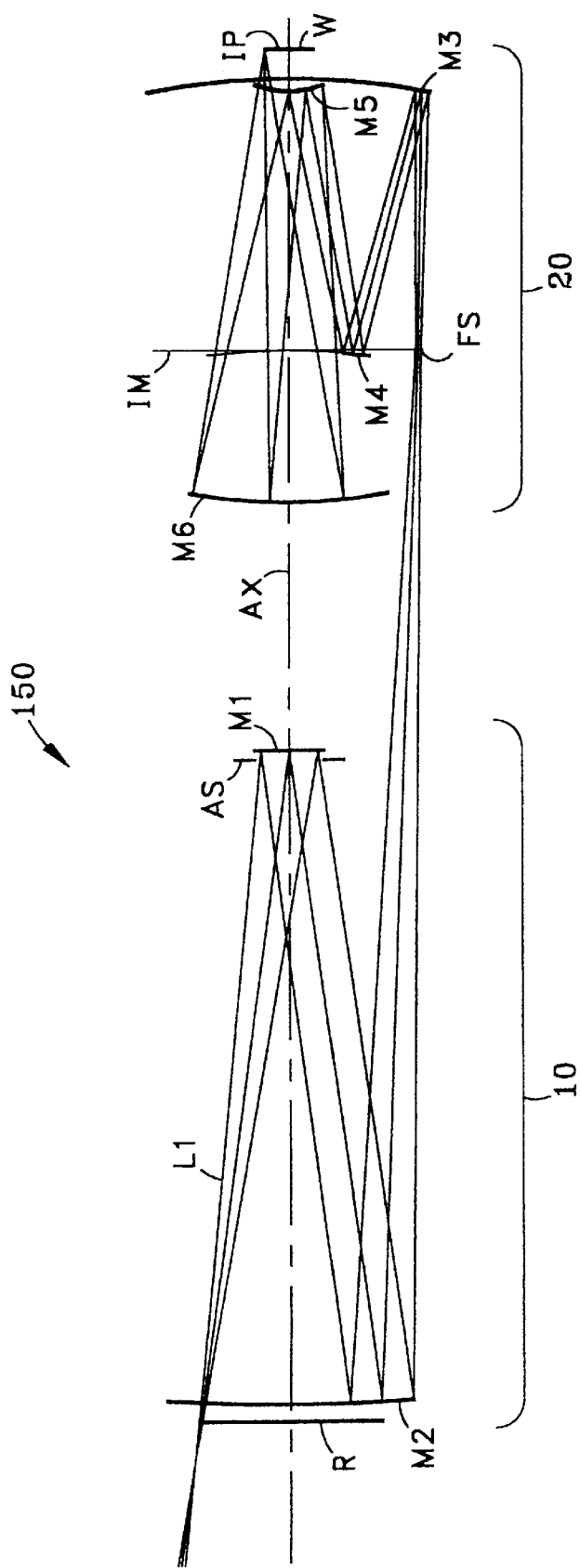
FIG. 4 is a cross-sectional schematic optical diagram of the catoptric reduction projection optical system according to a Working Example 2 of the present invention.
Figure 5A:
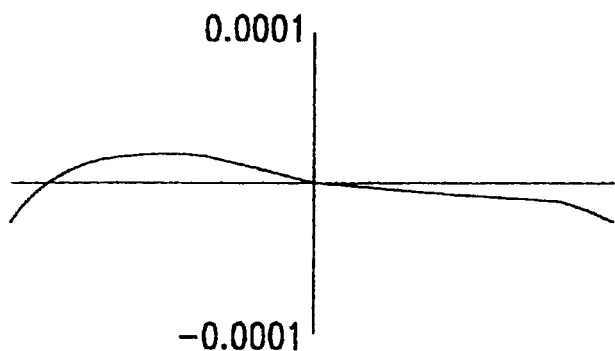
FIGS. 5a–5f are comatic aberration plots of Working Example 2.
Figure 5B:
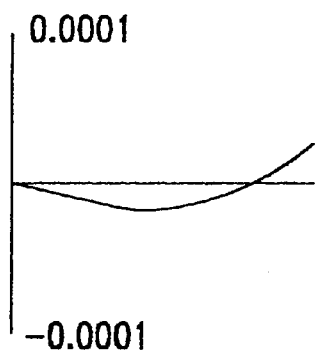
Figure 5C:
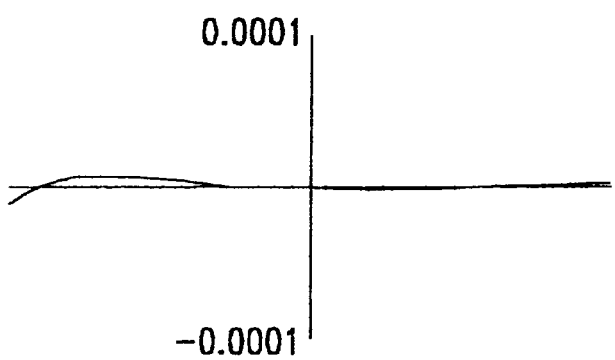
Figure 5D:
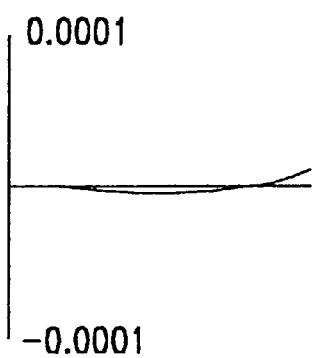
Figure 5E:
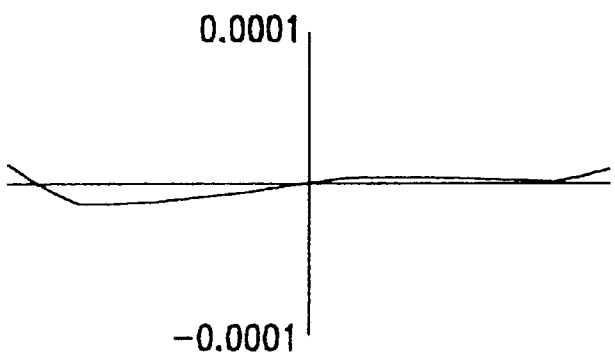
Figure 5F:
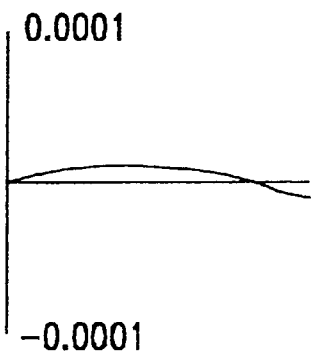

With reference to FIGS. 1 and 4, catoptric reduction projection optical systems 100 and 150 according to the present invention include a first catoptric optical system 10 that images a pattern (object) (not shown) present on a first surface (e.g., a reticle) R onto a second surface (intermediate image plane) IM, and a second catoptric optical system 20 that images second surface IM onto a third surface (e.g., a wafer) W. In this manner, a reduced image of the object on first surface R is formed onto third surface W located at an image plane IP.

First catoptric optical system 10 comprises, along an optical axis Ax, a first mirror pair comprising a first reflective mirror M1 and a second reflective mirror M2. Second catoptric optical system 20 comprises a second mirror pair comprising a third reflective mirror M3 (concave mirror) having a concave reflective surface and a fourth reflective mirror M4 having a reflective surface of a predetermined shape, and a third mirror pair comprising a fifth reflective mirror M5 (convex mirror) having a convex reflective surface and a sixth reflective mirror M6 (concave mirror) having a concave reflective surface.

With continuing reference to FIGS. 1–4, systems 100 and 150 operate as follows. Light beam L1 from first surface R travels via first mirror pair M1, M2 and forms an intermediate image (not shown) on second surface IM. Light beam L1 from the intermediate image is then reflected by second mirror pair M3, M4 in the order of third reflective mirror M3 and fourth reflective mirror M4. Light beam L1 reflected by second mirror pair M3, M4 is further reflected by third mirror pair M5, M6 in the order of fifth reflective mirror M5 and sixth reflective mirror M6, and is guided to third surface W. This arrangement makes it possible to obtain satisfactory imaging performance while keeping the diameters of the reflective mirrors small.

By adopting the above design, it is possible to arrange a field stop FS at second surface IM. If field stop FS is arranged at first surface R, it has the advantage that a field stop need not be provided in the illumination system (not shown) that illuminates first surface R.

The above design also makes it possible to arrange an aperture stop AS between the vertices of first mirror pair M1, M2. A vertex is the point at which the reflective surface and the reference axis of the reflective surface intersect. In this case, the shape of the opening of aperture stop AS can be made to surround the entire circumference of light beam L1 that passes through aperture stop AS, and the constitution of a regular aperture stop can be adopted. It is preferable to axially position aperture stop AS so that it is telecentric on the third surface W side. Furthermore, the reference axis of the reflective surface refers to the axis that connects the vertex of that reflective surface and the paraxial center of curvature of that reflective surface.

If aperture stop AS is not arranged between the vertices of first mirror pair M1, M2, then the manner in which light L1 reflects from first surface R, while controlling the generation of aberrations in first reflective mirror M1, can also be made to serve the function of aperture stop AS. In this case, it is preferable to set first reflective mirror M1 so that the principal ray from first surface R is reflected at the vertex of first reflective mirror M1. It is further preferable to position first reflective mirror M1 so that it is telecentric on the third surface W side.

It is also preferable in the present invention that first catoptric optical system 10 have a reduction magnification, and that second catoptric optical system 20 have a reduction magnification. This allows the magnification burden on each of catoptric optical systems 10, 20 to be lightened, since the reduction magnification of the entire catoptric reduction optical system can be shared by each of the catoptric optical systems 10, 20.

To obtain improved imaging performance in the catoptric reduction projection optical system, it is preferable to adequately control image plane IP (i.e., the imaging surface) related to the image of first surface R formed on third surface W. In this case, it is preferable, even in the optical system that forms arcuate imaging surfaces (or annular imaging surfaces) wherein arcuate regions (or annular regions) have a high degree of aberration correction at a given image height, to make the entire image plane, in addition to these arcuate imaging surfaces (or annular imaging surfaces), as flat as possible.

The Petzval sum generated by each of reflective mirrors M1 to M6 in the catoptric reduction projection optical system should be kept as small as possible. Accordingly, it is preferable to satisfy the following condition:

$$-0.005 < (p1+p2+p3+p4+p5+p6) < 0.005 \qquad (1)$$

wherein p1 is the paraxial curvature of first reflective mirror M1, p2 is the paraxial (curvature of second reflective mirror M2, p3 is the paraxial curvature of third reflective mirror M3 (concave mirror), p4 is the paraxial curvature of fourth reflective mirror M4, p5 is the paraxial curvature of fifth reflective mirror M5 (convex mirror), and p6 is the paraxial curvature of sixth reflective mirror M6 (concave mirror).

If (p1+p2+p3+p4+p5+p6) falls below the lower limit in condition (1), image plane IP has excessive concave curvature. Consequently, the amount of field curvature generated at third surface W (i.e., the surface of a photosensitive substrate, or the wafer surface) greatly exceeds the range wherein the catoptric reduction projection optical system can be corrected, leading to deterioration of the image. In addition, if (p1+p2+p3+p4+p5+p6) exceeds the upper limit in condition (1), image plane IP has excessive convex curvature. Consequently, the amount of field curvature generated at third surface W (surface of a photosensitive substrate, or the wafer surface) greatly exceeds the range wherein catoptric reduction projection optical system 100 or 150 can be corrected, leading to deterioration of the image.

It is also preferable in the present invention that at least four reflective mirrors among first reflective mirror M1 to sixth reflective mirror M6 have aspherical surfaces. This allows imaging performance to be improved, since high-order aberrations generated by each of the reflective mirrors M1 to M6 can be corrected with good balance.

In addition, it is preferable that first reflective mirror M1 have a reflective surface whose convex surface faces the first surface R side, and second reflective mirror M2 have a reflective surface whose concave surface faces the third surface W side. Thereby, first catoptric optical system 10 can be constructed compactly.

It is also preferable in the present invention to arrange first catoptric optical system 10 and second catoptric optical system 20 so that they have a predetermined spacing along optical axis Ax. Thereby, the number of off axis-shaped mirrors (i.e., mirrors having an asymmetric outline with respect to the reference axis) can be reduced, since the round-trip optical path between mirrors M1 to M6 can be reduced.

It is further preferable in the present invention to coaxially arrange, along common optical axis Ax, reflective mirrors M1, M2 that constitute the first mirror pair, reflective mirrors M3, M4 that constitute the second mirror pair, and reflective mirrors M5, M6 that constitute the third mirror pair. In other words, it is preferable to arrange each of the reflective mirrors M1 to M6 spaced apart by a predetermined spacing along optical axis Ax so that the vertex of each reflective mirror M1 to M6 is positioned along optical axis Ax, or so that the reference axis of each reflective mirror M1 to M6 coincides with optical axis Ax. This simplifies the assembly and adjustment of the lens barrel (not shown) of each mirror M1 to M6.

It is also preferable to arrange first, third and fifth reflective mirrors M1, M3, M5 so that their reflective surfaces face the first surface R side, and to arrange second, fourth and sixth reflective mirrors M2, M4, M6 so that their reflective surfaces face the third surface W side. Third, fourth and sixth reflective mirrors M3, M4, M6 are preferably arranged so that the vertex of fourth reflective mirror M4 is positioned between the vertex of third reflective mirror M3 (point at which the reflective surface of reflective mirror M3 and the reference axis of reflective mirror M3 intersect) and the vertex of sixth reflective mirror M6. In other words, it is further preferable to arrange third reflective mirror M3 and sixth reflective mirror M6 so that they interpose fourth reflective mirror M4 in the optical axis Ax direction. This allows the catoptric reduction projection optical system to be made sufficiently compact, since the distance between first surface R and third surface W can be shortened.

With continuing reference to FIG. 1, to achieve even greater overall compactness of the catoptric reduction projection optical system of the present invention, it is further preferable to arrange third to sixth reflective mirrors M3 to M6 so that the vertex of fourth reflective mirror M4 and the vertex of fifth reflective mirror M5 arc positioned between the vertex of third reflective mirror M3 and the vertex of sixth reflective mirror M6. In other words, it is further preferable to arrange third reflective mirror M3 and sixth reflective mirror M6 so that they interpose fourth reflective mirror M4 and fifth reflective mirror M5 in the optical axis Ax direction.

In addition, it is preferable, in principle, in the present invention to construct catoptric reduction projection optical system 100 only with the six reflective mirrors M1 to M6. Thereby, if catoptric reduction projection optical system 100 of the present invention is applied to a projection exposure apparatus that uses exposure light in the soft X-ray region with a wavelength of 5 to 15 nm, referred to herein as "EUV" (Extreme UltraViolet) light, or exposure light in the hard X-ray region below EUV wavelength light, then a sufficient quantity of exposure light can be ensured on an order that is acceptable for practical purposes, since there are only six reflective surfaces. This is true even if the reflectance of the reflective film in the relevant wavelength region is low. This is advantageous because the small number of reflective surfaces reduces the risk of deterioration in imaging performance due to errors in the surface shape of reflective surfaces.

Figure 2:
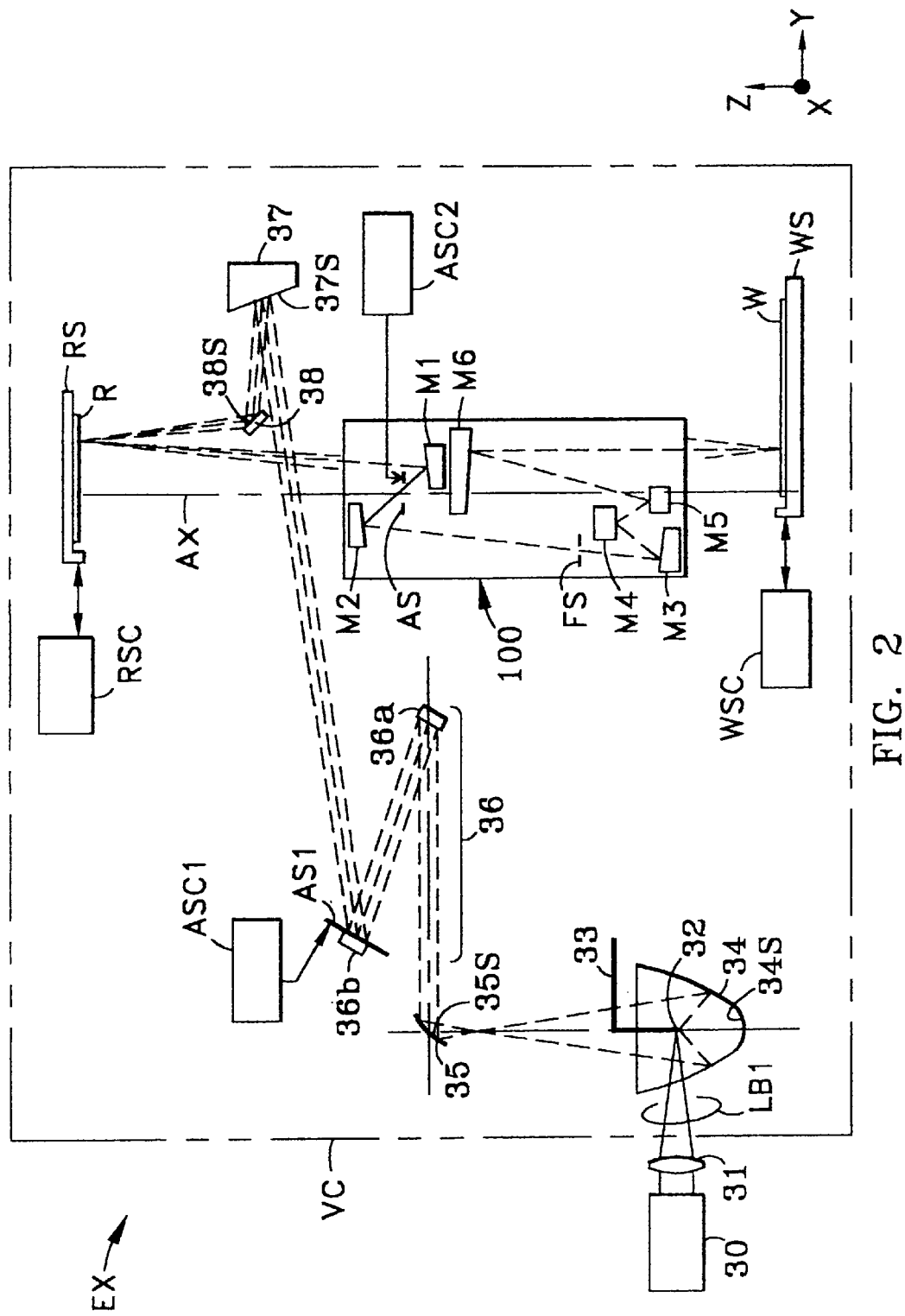
FIG. 2 is a schematic diagram of an exposure apparatus of the present invention which includes the catoptric reduction projection optical system of the present invention.
Figure 3A:
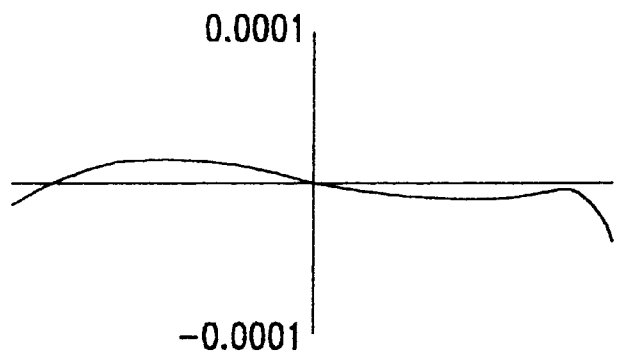
FIGS. 3a–f are comatic aberration plots for Working Example 1 of FIG. 1.
Figure 3B:
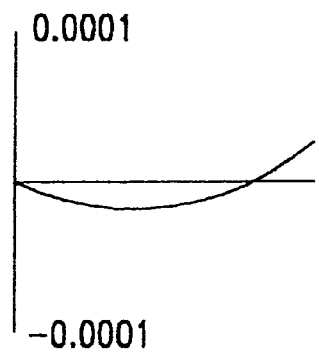
Figure 3C:
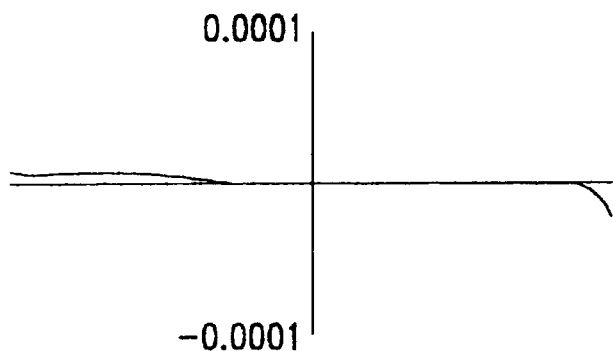
Figure 3D:
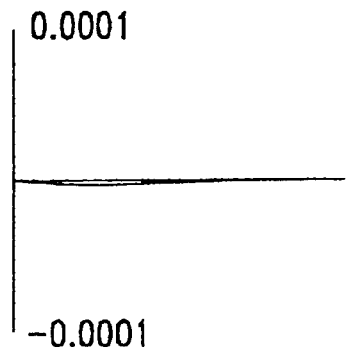
Figure 3E:
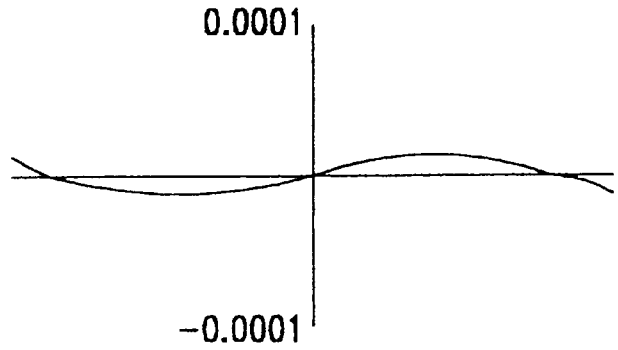
Figure 3F:
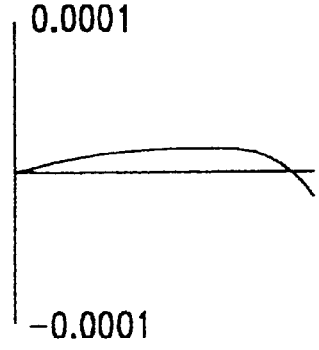

With reference now to FIG. 2, the overall construction of a projection exposure apparatus EX of the present invention, which includes catoptric reduction projection optical system 100 according to the present invention, is now explained. Apparatus EX uses exposure light in the soft X-ray region having a wavelength on the order of 5 to 15 nm (EUV light). Apparatus EX also performs the exposure operation by a step-and-scan method. Furthermore, in FIG. 2, the Z direction is the axial direction of the catoptric reduction projection optical system that forms a reduced image of catoptric reticle R onto wafer W. Also, the Y direction is a direction orthogonal to the Z direction and inside the paper surface, and the X direction is a direction orthogonal to the YZ direction and perpendicular to the paper surface.

Apparatus EX transfers a pattern (not shown), such as a circuit pattern, of catoptric reticle R onto each of a plurality of exposure regions ER on wafer W by a step-and-scan method. This method involves scanning reticle R and wafer W in one direction (herein, the Y axis direction) with respect to catoptric reduction projection optical system 100 while projecting the image of one part of the a circuit pattern onto wafer W as the photosensitive substrate via catoptric reduction projection optical system 100. Since EUV light has low transmittance with respect to the atmosphere, the optical path through which the EUV light passes is cut off from outside air by enclosing it with vacuum chamber VC.

First, the illumination optical system in FIG. 2 will be explained. The illumination optical system includes a laser light source 30 capable of supplying a laser light beam LB1 having a wavelength in a range from the infrared region to the visible region. Laser light source 30 may be, for example, a semiconductor laser-excited YAG laser or excimer laser. Laser light beam LB1 is condensed by a first condenser optical system 31 to a position 32. A nozzle 33 jets gaseous matter toward position 32, and this jetted matter is subject to condensed laser light beam LB1, which has a high illumination intensity at position 32. The temperature of the jetted matter rises due to the energy of condensed laser light beam LB1, is excited to the plasma state, and discharges EUV light LB2 when it transitions to a low potential state.

The illumination optical system further includes an elliptical mirror 34 having an inner surface 34S, constituting a second condenser optical system is arranged around position 32. Elliptical mirror 34 is positioned so that its first focal point substantially coincides with position 32. Inner surface 34S of elliptical mirror 34 is provided with a multilayered film to reflect EUV light, which first converges at the second focal point of elliptical mirror 34 and then proceeds to a parabolic mirror 35 having an inner surface 35S. Parabolic mirror 35 serves as the collimator mirror that constitutes the third condenser optical system, and is positioned so that its focal point substantially coincides with the second focal point position of elliptical mirror 34. Inner surface 35S is provided with a multilayered film for reflecting EUV light.

EUV light LB2 emitted from parabolic mirror 35 proceeds to a catoptric flyeye optical system 36, which serves as an optical integrator, in a substantially collimated state. Catoptric flyeye optical system 36 comprises a first catoptric element group 36a that integrates light via a plurality of reflective surfaces, and second catoptric element group 36b having a plurality of reflective surfaces corresponding to the plurality of reflective surfaces of first catoptric element group 36a. A multilayered film for reflecting EUV light is also provided on the plurality of reflective surfaces that constitute first and second catoptric element groups 36a, 36b.

The wavefront of collimated EUV light LB2 from parabolic mirror 35 is divided by first catoptric element group 36a, and the EUV light from each of these reflective surfaces is converged to form a plurality of light source images. The plurality of reflective surfaces of second catoptric element group 36b is positioned in the vicinity of the position wherein this plurality of light source images is formed. The plurality of reflective surfaces of second catoptric element group 36b effectively serves as a field mirror. Thus, catoptric flyeye optical system 36 forms a plurality of light source images as secondary light sources using the approximately parallel light beam from parabolic mirror 35. Furthermore, such a catoptric flyeye optical system 36 is disclosed in Japanese Patent Application Hei 10-47400, filed by the present applicant.

In the present mode for carrying out the present invention, σ stop AS1 is provided as the first aperture stop in the vicinity of second catoptric element group 36b in order to control the shape of the secondary light sources. σ stop AS1 comprises a turret T within which is provided, for example, a plurality of apertures of different shapes. Furthermore, a σ stop control unit ASC1 in communication with turret T controls which aperture is arranged in the optical path.

EUV light LB2 from the secondary light sources formed by catoptric flyeye optical system 36 proceeds to a condenser mirror 37 having a surface 37S. Mirror 37 is positioned so that the vicinity of the position of these secondary light sources is at the focal point position of mirror 37, and are reflected and condensed by condenser mirror 37. EUV light LB2 then arrives at catoptric reticle R via a fold mirror 38 having a surface 38S. Condenser mirror 37 converges EUV light LB1 emitted from the secondary light sources, and superpositions the light sources so as to uniformly illuminate catoptric reticle R. A multilayered film that reflects EUV light is provided on surface 37S of condenser mirror 37 and surface 38S folding mirror 38.

In the present mode for carrying out the present invention, to spatially separate the optical path of the illumination light that proceeds to catoptric reticle R and the optical path of the EUV light reflected by catoptric reticle R and that proceeds to projection system 100, the illumination system is made non-telecentric. Also, catoptric reduction projection optical system 100 is made a non-telecentric on the reticle R side. Further, a reflective film comprising a multilayered film that reflects EUV light is provided on catoptric reticle R. This reflective film forms a pattern in accordance with the shape of the pattern to be transferred onto wafer W as the photosensitive substrate. EUV light LB2 reflected by catoptric reticle R and that includes the pattern information thereon proceeds to catoptric reduction projection optical system 100.

As described above with reference to FIG. 1, catoptric reduction projection optical system 100 comprises six mirrors M1 to M6, and variable aperture stop AS as the second aperture stop is arranged in the optical path between mirror M1 and catoptric reticle R (between the vertices of mirror M1 and mirror M2). Variable aperture stop AS is variable, and is controlled by a variable aperture stop control unit ASC2 in communication therewith. In addition, field stop FS is arranged at intermediate image formation position IM in the optical path between mirror M2 and mirror M3 (see FIG. 1). Furthermore, a multilayered film that reflects EUV light is provided on the substrates of mirrors M1 to M6.

EUV light LB2 reflected by catoptric reticle R passes through catoptric reduction projection optical system 100, and forms a reduced image of the pattern of catoptric reticle R with predetermined reduction magnification p (for example, $|\beta|=¼, ⅕, ⅙$) in an arcuate exposure region on wafer W. Furthermore, in the present mode for carrying out the present invention, the shape of exposure region ER is specified by field stop FS provided in catoptric reduction projection optical system 100. Catoptric reticle R is supported by a reticle stage RS moveable at least along the Y direction, and wafer W is supported by a wafer stage WS moveable along the X, Y and Z directions. The movement of reticle stage RS is controlled by a reticle stage control unit RSC in communication therewith and wafer stage WS is controlled by a wafer stage control unit WSC in communication therewith, When performing the exposure operation, catoptric reticle R is illuminated with EUV light LB2 from the illumination system, and catoptric reticle R and wafer W are moved with respect to catoptric reduction projection optical system 100 at a predetermined speed ratio prescribed by the reduction magnification of the projection optical system 100. The pattern of catoptric reticle R is scanned and exposed in a predetermined exposure region ER on wafer W.

It is preferable in the present mode for carrying out the present invention to make σ stop AS1, variable aperture stop AS, and field stop FS of a metal like Au, Ta, W and the like to sufficiently block EUV light. In addition, the reflective surface of each mirror discussed above is formed as a multilayered film as the reflective film for reflecting EUV light. This multilayered film is formed by layering a plurality of substances from among molybdenum, ruthenium, rhodium, silicon and silicon oxides.

Working Examples

The following explains numerical Working Examples of the catoptric reduction projection optical system according to the present invention. FIG. 1 is a cross-sectional schematic optical path diagram of the catoptric reduction projection optical system of Working Example 1, and FIG. 4 is a cross-sectional schematic optical path diagram of the catoptric reduction projection optical system 150 of Working Example 2. FIG. 1 and FIG. 4 show only the lateral cross-sectional width of the light beams.

Fourth reflective mirror M4 is, in Working Example 1 of FIG. 1, a plane mirror having a plane reflective surface and, in Working Example 2 of FIG. 4, is a convex mirror having a convex spherical reflective surface. In addition, the reflective surfaces of first reflective mirror M1 (concave mirror), second reflective mirror M2 (concave mirror), third reflective mirror M3 (concave mirror), fifth reflective mirror M5 (convex mirror) and sixth reflective mirror M6 (concave mirror) are formed as aspherical surfaces that are rotationally symmetric with respect to optical axis Ax.

Reflective mirrors M1 to M6 are arranged coaxially along common optical axis Ax and, furthermore, field stop FS is arranged at second surface IM wherein an intermediate image is formed in the optical path between second reflective mirror M2 (concave mirror) and third reflective mirror M3 (concave mirror).

In addition, in Working Example 1 as shown in FIG. 1, aperture stop AS is arranged along optical axis Ax in the optical path between first reflective mirror M1 (concave mirror) and second reflective mirror M2 (concave mirror). In Working Example 2 shown in FIG. 4, aperture stop AS is arranged immediately before first reflective mirror M1 (concave mirror) arranged along optical axis Ax. Also, aperture stop AS arranged immediately before first reflective mirror M1 (concave mirror) may be removed, and first reflective mirror M1 (concave mirror) arranged on optical axis Ax may itself be made to function as aperture stop AS. Furthermore, light L1 from first surface R is sequentially reflected by first reflective mirror M1 (concave mirror) and second reflective mirror M2 (concave mirror), and forms a reduced image (intermediate image or spatial image) on second surface IM. Light L1 from this reduced image is sequentially reflected by third reflective mirror M3 (concave mirror), fourth reflective mirror M4 (plane mirror or convex mirror), fifth reflective mirror M5 (convex mirror) and sixth reflective mirror M6 (concave mirror), is guided to third surface W, where a reduced image on third surface W is formed.

As discussed above, each reflective mirror M1, M2, M3, M5, M6 in Working Example 1 and Working Example 2 has an aspherical surface shape, which is expressed by the following formula.

$$Y = \frac{cr^2}{1+\sqrt{1-(1+k)c^2r^2}} + Ar^4 + Br^6 + Cr^8 + Dr^{10}$$

wherein:
Y: Distance from central tangential plane to aspherical surface,
c: Center curvature (center curvature at paraxial region),
r: Distance from optical axis,
k: Conical constant,
A: Fourth-order aspherical coefficient,
B: Sixth-order aspherical coefficient,
C: Eighth-order aspherical coefficient, and
D: Tenth-order aspherical coefficient.

In the catoptric reduction projection optical system 100 of Working Example 1, the wavelength of the EUV light (exposure wavelength) is 13.4 nm, the reduction magnification |β| is ¼X, imagewise numerical aperture NA is 0.14, and the maximum object height is 120 mm. Exposure region ER is an annular shape having a radius of 30 mm and width of 1 mm. By performing scanning exposure, an overall exposure region ER of 26×33 mm can be exposed. The distance between first surface R as the object plane and third surface W as the last image plane is 1595.0 mm, and the maximum effective diameter among the effective diameters of the plurality of reflective mirrors M1 to M6 is 344 mm.

In the catoptric reduction projection optical system 150 of Working Example 2, the wavelength of the EUV light (exposure wavelength) is 13.4 nm, the reduction magnification |β| is ¼X, imagewise numerical aperture NA is 0.16, and the maximum object height is 140 mm. Exposure region ER is an annular shape having a radius of 35 mm and width of 1 mm. By performing scanning exposure, an overall exposure region ER of 26×33 mm can be exposed. In addition, the distance between first surface R as the object plane and third surface W as the last image plane is 2185 mm, and the maximum effective diameter among the effective diameters of the plurality of reflective mirrors M1 to M6 is 412 mm.

Tables 1–4 below list the values of the specifications of the catoptric reduction projection optical systems of Working Example 1 and Working Example 2. In Table 1 and Table 3, the left column indicates the surface number of each reflective surface, RDY indicates the radius of curvature of each optical surface, THI indicates the surface spacing between each reflective surface. The RDY column indicates the paraxial radius of curvature of each reflective surface, and the THI column indicates each surface spacing. In addition, in Table 1 and Table 3, D0 is the distance from first surface R (reticle surface) to the optical surface most on the first surface R side, WD is the distance from the optical surface most on the third surface W side to third surface W (last image plane), β is the lateral magnification of the catoptric reduction projection optical system when light from the first surface side enters the catoptric reduction projection optical system. NA is the numerical aperture on the third surface W side. Furthermore, in Table 1 and Table 2, the sign of paraxial radius of curvature RDY is positive when convex toward the first surface R side, and the sign of surface spacing THI reverses after a reflective surface. In addition, Table 2 and Table 4 list the aspherical surface data for mirrors M1 to M6 in Working Example 1 and Working Example 2. Table 5 summarizes the values associated with condition (1).

TABLE 1

WORKING EXAMPLE 1
D0 = 757.117396
WD = 576.935270
|β| = 0.2500
NA = 0.14

| Surface No. | RDY | THI | |
|---|---|---|---|
| 0 | ∞ | 757.117396 | First surface R (object plane) |
| 1 | −2135.61850 | −239.749734 | First reflective mirror M1 |
| 2 | ∞ | −497.311302 | Aperture stop AS |
| 3 | 1633.92933 | 1076.234142 | Second reflective mirror M2 |
| 4 | ∞ | 423.765858 | Second surface IM (intermediate image plane) |
| 5 | −1217.95966 | −342.390482 | Third reflective mirror M3 |
| 6 | ∞ | 317.354495 | Fourth reflective mirror M4 |
| 7 | 322.28640 | −676.935270 | Fifth reflective mirror M5 |
| 8 | 800.74358 | 576.935270 | Sixth reflective mirror M6 |
| 9 | ∞ | | Third surface W (last image plane) |

TABLE 2

Aspherical Surface Data of Working Example 1

First Reflective Mirror M1 k = −453.902656
A = −0.570629 × 10$^{-8}$
B = 0.267085 × 10$^{-12}$
C = −0.155813 × 10$^{-16}$
D = 0.661889 × 10$^{-21}$

Second Reflective Mirror M2 k = −1.150808
A = −0.525980 × 10$^{-10}$
B = 0.112304 × 10$^{-15}$
C = 0.676653 × 10$^{-20}$
D = −0.235135 × 10$^{-24}$

Third Reflective Mirror M3 k = −0.186505
A = −0.217618 × 10$^{-9}$
B = 0.303070 × 10$^{-14}$
C = −0.593817 × 10$^{-19}$
D = 0.490716 × 10$^{-24}$

Fifth Reflective Mirror M5 k = 1.222041
A = 0.404395 × 10$^{-8}$
B = 0.230630 × 10$^{-12}$
C = 0.232474 × 10$^{-16}$
D = −0.784925 × 10$^{-20}$

Sixth Reflective Mirror M6 k = 0.219648
A = −0.385094 × 10$^{-10}$
B = −0.681096 × 10$^{-16}$
C = −0.862824 × 10$^{-22}$
D = −0.350660 × 10$^{-27}$

TABLE 3

WORKING EXAMPLE 2
D0 = 1049.189977
WD = 751.968366
|β| = 0.2501
NA = 0.16

| Surface No. | RDY | THI | |
|---|---|---|---|
| 0 | ∞ | 1049.189977 | First surface R (object plane) |
| 1 | −2493.96981 | −0.396074 | First reflective mirror M1 |
| 2 | ∞ | −1018.793902 | Aperture stop AS |
| 3 | 2868.12432 | 1749.721463 | Second reflective mirror M2 |
| 4 | ∞ | 362.962079 | Second surface IM (intermediate image plane) |
| 5 | −1217.27799 | −365.261250 | Third reflective mirror M3 |
| 6 | −1358.85881 | 358.216517 | Fourth reflective mirror M4 |
| 7 | 491.22665 | −701.968366 | Fifth reflective mirror M5 |
| 8 | 814.86129 | 751.968366 | Sixth reflective mirror M6 |
| 9 | ∞ | | Third surface W (last image plane) |

TABLE 4

Aspherical Surface Data of Working Example 2

First Reflective Mirror M1 k = −299.966757
A = −0.243328 × $10^{-8}$
B = 0.585557 × $10^{-13}$
C = −0.121983 × $10^{-17}$
D = −0.374022 × $10^{-22}$

Second Reflective Mirror M2 k = 2.719373
A = −0.330976 × $10^{-10}$
B = −0.423790 × $10^{-17}$
C = 0.430368 × $10^{-22}$
D = −0.642242 × $10^{-27}$

Third Reflective Mirror M3 k = 0.654604
A = −0.240362 × $10^{-9}$
B = 0.303275 × $10^{-14}$
C = −0.329839 × $10^{-19}$
D = 0.144797 × $10^{-24}$

Fifth Reflective Mirror M5 k = 1.224567
A = 0.444080 × $10^{-8}$
B = 0.557993 × $10^{-13}$
C = 0.138484 × $10^{-17}$
D = −0.639359 × $10^{-22}$

Sixth Reflective Mirror M6 k = 0.224995
A = −0.370854 × $10^{-10}$
B = −0.591353 × $10^{-16}$
C = −0.893475 × $10^{-22}$
D = 0.795162 × $10^{-29}$

TABLE 5

| | Working Example 1 | Working Example 2 |
|---|---|---|
| p1 | −0.000936 | −0.000802 |
| p2 | −0.001224 | −0.000697 |
| p3 | −0.001643 | −0.001643 |
| p4 | 0.0 | 0.001472 |
| p5 | 0.006206 | 0.004071 |
| p6 | −0.002498 | −0.002454 |
| p1 + p2 + p3 + p4 + p5 + p6 | −0.000080 | −0.000053 |

FIG. 3 and FIG. 5 show comatic aberration plots at first surface R of the catoptric reduction projection optical systems of Working Example 1 and Working Example 2. These comatic aberration plots were obtained by ray tracing from third surface W side using light of a 13.4 nm wavelength. FIG. 3a is a comatic aberration plot in the meridional direction at object height Y=122 mm, FIG. 3b is a comatic aberration plot in the meridional direction at object height Y=120 mm, FIG. 3c is a comatic aberration plot in the meridional direction at object height Y=118 mm, FIG. 3d is a comatic aberration plot in the sagittal direction at object height Y=122 mm, FIG. 3e is a comatic aberration plot in the sagittal direction at object height Y=120 mm, and FIG. 3f is a comatic aberration plots in the sagittal direction at object height Y=118 mm. FIG. 5a is a comatic aberration plot in the meridional direction at object height Y=142 mm, FIG. 5b is a comatic aberration plot in the meridional direction at object height Y=140 mm, FIG. 5c is a comatic aberration plot in the meridional direction at object height Y=138 mm, FIG. 5d is a comatic aberration plot in the sagittal direction at object height Y=142 mm, FIG. 5e is a comatic aberration plot in the sagittal direction at object height Y=140 mm, and FIG. 5f is a comatic aberration plot in the sagittal direction at object height Y=138 mm.

As can be seen from FIGS. 3a–f and FIGS. 5a–f, for catoptric reduction projection optical systems 100 and 150 of Working Example 1 and Working Example 2, respectively, spherical aberration and coma for EUV light at the single wavelength of 13.4 nm are satisfactorily corrected to a state that is substantially aberration free, and distortion is satisfactorily corrected in exposure region ER.

In Working Example 1 and Working Example 2, the reflective surfaces of the five reflective mirrors M1, M2, M3, M5, M6 are formed as high-order aspherical surfaces that are rotationally symmetric with respect to optical axis Ax. Consequently, high-order aberrations generated by each reflective mirror M1 to M6 are corrected, and satisfactory imaging performance is achieved. To correct rotationally asymmetric aberration components arising from errors like errors in the surface shape of the reflective surface of each mirror and errors in assembly during the manufacture of the catoptric reduction projection optical system, aspherical surfaces are preferable rotationally asymmetric. Fourth reflective mirror M4 is also preferably formed as an asymmetric shape that is rotationally symmetric with respect to optical axis Ax, and so that the reflective surfaces of all six reflective mirrors M1 to M6 are formed as aspherical surfaces.

In Working Example 1 and Working Example 2 discussed above, EUV light having a 13.4 nm wavelength is used as the working wavelength. However, the catoptric reduction projection optical system according to the present invention is not limited to the use of EUV light. The catoptric reduction projection optical system according to the present invention can also use, for example, light in the hard X-ray region under 5 nm or in the vacuum ultraviolet region of 100–200 nm. Furthermore, synchrotron radiation light, for example, can be used as a light source in the hard X-ray region, and an ArF excimer laser (193 nm wavelength) or an $F_2$ excimer laser (157 nm wavelength) and the like can be used as a light source in the vacuum ultraviolet region.

In Working Example 1 shown in FIG. 1 and in Working Example 2 shown in FIG. 4, third to sixth reflective mirrors M3 to M6 are arranged so that the vertex of fourth reflective mirror M4 and the vertex of fifth reflective mirror M5 are positioned between the vertex of third reflective mirror M3 and the vertex of sixth reflective mirror M6. In other words, in each of the above Working Examples, third reflective mirror M3 and sixth reflective mirror M6 are arranged so that they interpose fourth reflective mirror M4 and fifth reflective mirror M5 in the optical axis Ax direction.

The catoptric reduction optical system according to the present invention is not limited to that described in each Working Example shown in FIG. 1 and FIG. 4. For example, the vertex of third reflective mirror M3 in each Working Example shown in FIG. 1 and FIG. 4 may be arranged on the first surface R side of the vertex of fifth reflective mirror M5. In this case, third to sixth reflective mirrors M3 to M6 are arranged so that the vertex of fourth reflective mirror M4 and the vertex of third reflective mirror M3 are positioned between the vertex of fifth reflective mirror M5 and the vertex of sixth reflective mirror M6. In other words, fifth reflective mirror M5 and sixth reflective mirror M6 are arranged so that they interpose fourth reflective mirror M4 and third reflective mirror M3 in the optical axis Ax direction. By adopting such a construction, it is possible to make the overall size of the catoptric reduction projection optical system compact, since the distance between first surface R and third surface W can be reduced.

As described above, the present invention obtains extremely excellent imaging performance while keeping the diameter of the reflective mirrors small, even while using on the order of six reflective surfaces, by using an aberration correction principle different from the conventional Offner-type or modified Offner-type optical system.

The present invention is imagewise telecentric and can correct aberrations with good balance while maintaining the symmetry of the various aberrations in the optical system for six reflective surfaces and, furthermore, can arrange the aperture stop at an appropriate position without sacrificing the effective light beam.

By applying the projection optical system according to the present invention to an exposure apparatus or to a photolithographic process for manufacturing semiconductors, satisfactory semiconductor devices and the like having higher levels of integration can be manufactured since finer pattern images on a reticle or mask can be transferred and exposed onto a photosensitive substrate in a substantially aberration-free state.

While the present invention has been described with preferred embodiments, its will be understood that it is not limited to those embodiments. On the contrary, it is intended to cover all alternatives, modifications and equivalents as may be included within the spirit and scope of the invention as defined in the appended claims.

What is claimed is:

1. A catoptric reduction projection optical system capable of forming a reduced magnification image of an object present on a first surface onto a third surface, comprising:
    a) a first catoptric optical system capable of forming an intermediate image of the object onto a second surface, said first catoptric optical system comprising a first mirror pair having a first reflective mirror and a second reflective mirror;
    b) a second catoptric optical system capable of imaging said intermediate image formed on said second surface onto the third surface, said second catoptric optical system comprising a second mirror pair having a third reflective mirror with a concave reflective surface and a fourth reflective mirror with a reflective surface of a predetermined shape, and a third mirror pair having a fifth reflective mirror with a convex reflective surface and a sixth reflective mirror with a concave reflective surface; and
    c) wherein light from said first surface forms said intermediate image on said second surface after reflecting from said first mirror pair, the light from said intermediate image is reflected by said second mirror pair in the order of said third reflective mirror and said fourth reflective mirror, and the light reflected by said second mirror pair is further reflected by said third mirror pair in the order of said fifth reflective mirror and said sixth reflective mirror, and is then guided to said third surface.

2. The catoptric reduction projection optical system according to claim 1, wherein a field stop is arranged on said second surface.

3. The catoptric reduction projection optical system according to claim 1, further including an aperture stop arranged between a vertex of said first reflective mirror and a vertex of said second reflective mirror, wherein said aperture stop has a shape that fully surrounds a light beam entering said aperture stop.

4. The catoptric reduction projection optical system according to claim 2, further including an aperture stop arranged between a vertex of said first reflective mirror and a vertex of said second reflective mirror that constitute first mirror pair, wherein said aperture stop has a shape that fully surrounds a light beam entering said aperture stop.

5. The catoptric reduction projection optical system according to claim 3, wherein said aperture stop is telecentric on said third surface side.

6. The catoptric reduction projection optical system according to claim 4, wherein said aperture stop is telecentric on said third surface side.

7. The catoptric reduction projection optical system according to claim 1, wherein said first reflective mirror reflects a principal ray from said first surface at a vertex of said first reflective mirror.

8. The catoptric reduction projection optical system according to claim 2, wherein said first reflective mirror reflects a principal ray from said first surface at a vertex of said first reflective mirror.

9. The catoptric reduction projection optical system according to claim 7, wherein said first reflective mirror is positioned so that it is telecentric on said third surface side.

10. The catoptric reduction projection optical system according to claim 7, wherein said first reflective mirror is positioned so that it is telecentric on said third surface side.

11. The catoptric reduction projection optical system according to claim 1, wherein said first catoptric optical system and said second catoptric optical system each have a reduction magnification.

12. The catoptric reduction projection optical system according to claim 1, satisfying the following condition:

$$-0.005 < (p1+p2+p3+p4+p5+p6) < 0.005$$

wherein p1 is a paraxial curvature of said first reflective mirror, p2 is a paraxial curvature of said second reflective mirror, p3 is a paraxial curvature of said third reflective mirror, p4 is a paraxial curvature of said fourth reflective mirror, p5 is a paraxial curvature of said fifth reflective mirror, and p6 is a paraxial curvature of said sixth reflective mirror.

13. The catoptric reduction projection optical system according to claim 1, wherein at least four of the reflective mirrors among said first reflective mirror to said sixth reflective mirror have aspherical surfaces.

14. The catoptric reduction projection optical system according to claim 1, wherein said first reflective mirror has a reflective surface whose convex surface faces the first surface side, and said second reflective mirror has a reflective surface whose concave surface faces the third surface side.

15. The catoptric reduction projection optical system according to claim 1, wherein said first catoptric optical system and said second catoptric optical system are axially spaced apart.

16. The catoptric reduction projection optical system according to claim 1, wherein said first reflective mirror through said sixth reflective mirror are arranged coaxially along an optical axis.

17. The catoptric reduction projection optical system according to claim 1, wherein said first reflective mirror, said third reflective mirror and said fifth reflective mirror are each arranged so that their reflective surfaces face said first surface side, and said second reflective mirror, said fourth reflective mirror and said sixth reflective mirror are each arranged so that their reflective surfaces face said third surface side.

18. The catoptric reduction projection optical system according to claim 1, wherein said third reflective mirror, said fourth reflective mirror and said sixth reflective mirror each have a vertex, and wherein the vertex of said fourth reflective mirror is positioned between the vertex of said third reflective mirror and the vertex of said sixth reflective mirror.

19. A projection exposure apparatus for exposing a photosensitive substrate with an image of a reticle, comprising:
  a) an illumination optical system that guides exposure light having an exposure wavelength to the reticle;
  b) a projection optical system according to claim I arranged to receive said exposure light from said reticle to form a reduced image of the reticle and to expose said image onto the photosensitive substrate; and
  c) wherein the exposure is performed while moving the reticle and the photosensitive substrate relative to said catoptric reduction projection optical system.

20. A method of exposing a photosensitive substrate with a reduced image of a reticle, the method comprising the steps of:
  a) providing the projection exposure apparatus of claim 19;
  b) guiding light from said illumination optical system to said reticle; and
  c) forming a reduced image of said reticle onto the photosensitive substrate with said projection exposure apparatus while scanning the reticle and the photosensitive substrate relative to said projection exposure apparatus.

21. A projection exposure apparatus including a projection system that projects a pattern of a reticle onto a substrate, comprising:
  a) a first catoptric optical system having a first reflective mirror and a second reflective mirror, the first catoptric optical system forming an intermediate image of the pattern onto a predetermined surface; and
  b) a second catoptric optical system having a third reflective mirror and a fourth reflective mirror, a fifth reflective mirror and a sixth reflective mirror, wherein the second catoptric optical system images said intermediate image formed on said predetermined surface onto the surface;
  c) wherein light from the pattern forms the intermediate image onto the predetermined surface after reflecting from the first reflective mirror and the second reflective mirror, the light from the intermediate image is reflected in order by the third reflective mirror, the fourth reflective mirror, the fifth reflective mirror and the sixth reflective mirror, and is then guided to the substrate.

22. The projection exposure apparatus according to claim 21, further comprising a field stop disposed on said predetermined surface.

23. The projection exposure apparatus according to claim 21, further comprising an aperture stop arranged between a vertex of said first reflective mirror and a vertex of said second reflective mirror, wherein said aperture stop has a shape that fully surrounds a light beam entering said aperture stop.

24. The projection exposure apparatus according to claim 21, wherein said first reflective mirror is positioned so that it is telecentric on said substrate side.

25. The projection exposure apparatus according to claim 21, wherein said first catoptric optical system and said second catoptric optical system each have a reduction magnification.

26. The projection exposure apparatus according to claim 21, wherein at least four of the reflective mirrors among said first reflective mirror to said sixth reflective mirror have aspherical surfaces.

27. The projection exposure apparatus according to claim 21, wherein the reticle and the substrate are scanned in one direction.

28. An exposure method for projecting a pattern of a reticle onto a substrate, comprising steps of:
  a) illuminating light on the pattern of the recticle;
  b) transmitting the light from the pattern to a first catoptric optical system having a first reflective mirror and a second reflective, the first catoptric optical system forming an intermediate image of the pattern onto a predetermined surface;
  c) transmitting the light from the first catoptric optical system to a second catoptric optical system having a third reflective mirror, a fourth reflective mirror, a fifth reflective mirror and a sixth reflective mirror, the second catoptric optical system imaging said intermediate image formed on said predetermined surface onto the substrate;
  d) wherein light from the pattern forms the intermediate image onto the predetermined surface after reflecting from the first reflective mirror and the second reflective mirror, the light from the intermediate image is reflected in order by the third mirror, the fourth reflective mirror, the fifth reflective mirror and the sixth reflective mirror, and is then guided to the substrate.

29. The exposure method according to claim 28, further comprising a step of disposing a field stop on said predetermined surface.

30. The exposure method according to claim 28, further comprising a step of disposing an aperture stop between a vertex of said first reflective mirror and a vertex of said second reflective mirror, wherein said aperture stop has a shape that fully surrounds a light beam entering said aperture stop.

31. The exposure method according to claim 28, wherein said first reflective mirror is positioned so that it is telecentric on said substrate side.

32. The exposure method according to claim 28, wherein said first catoptric optical system and said second catoptric optical system each have a reduction magnification.

33. The exposure method according to claim 28, wherein at least four of the reflective mirrors among said first reflective mirror to said sixth reflective mirror have aspherical surfaces.

34. The exposure method according to claim 28, wherein the reticle and the substrate are scanned in one direction.

* * * * *